United States Patent [19]

Hanson

[11] 3,818,365

[45] June 18, 1974

[54] MICROWAVE AMPLIFIER CIRCUIT UTILIZING NEGATIVE RESISTANCE DIODE

[75] Inventor: Delon C. Hanson, Los Altos, Calif.

[73] Assignee: Hewlett-Packard Company, Palo Alto, Calif.

[22] Filed: Aug. 23, 1971

[21] Appl. No.: 173,766

[52] U.S. Cl. .................................. 330/53, 330/61 A

[51] Int. Cl. ................................................ H03f 3/60

[58] Field of Search ......... 330/61 A, 34, 5; 307/322; 331/107 T, 115, 107 C, 107 R; 328/241

[56] References Cited

UNITED STATES PATENTS

| | | | |
|---|---|---|---|
| 3,080,530 | 3/1963 | Smith, Jr. | 330/34 X |
| 3,234,485 | 2/1966 | Graser, Jr. | 331/107 T |
| 3,509,478 | 4/1970 | Thim | 330/5 |
| 3,621,465 | 11/1971 | Beaty | 307/322 X |
| 3,628,167 | 12/1971 | Hines | 330/61 A X |
| 3,638,143 | 1/1972 | Higashi et al. | 331/107 T |
| 3,646,466 | 2/1972 | Crowe | 330/6 A X |

*Primary Examiner*—Nathan Kaufman
*Attorney, Agent, or Firm*—A. C. Smith

[57] ABSTRACT

A solid state microwave amplifier circuit comprising a series connected inductor and negative resistance diode coupled in series with an input transmission line serving to transform the input impedance down to a desired level, the DC biasing for the negative resistance diode being coupled to the circuit via a high impedance line connected to the circuit between the transmission line and the inductor. The circuit is operable in the negative resistance amplifier mode or the oscillator mode. A varactor diode, when coupled in series between the transmission line and the inductor, serves to electrically tune the oscillator. A plurality of said amplifier circuits are coupled together to form a power combiner, said amplifier circuits having independent biasing circuits with means for DC isolation between the individual amplifiers. A loading circuit between the power combiner amplifiers prevents power cancellation. A microwave amplifier operating as a locked oscillator serves as one stage of a microwave amplifier package and power combiner including a plurality of microwave amplifiers operating as locked oscillators serves as a second stage of the package.

3 Claims, 6 Drawing Figures

INVENTOR
DELON C. HANSON

BY

ATTORNEY

INVENTOR
DELON C. HANSON

BY

ATTORNEY

INVENTOR
DELON C. HANSON
BY
ATTORNEY

INVENTOR
DELON C. HANSON
BY
ATTORNEY

MICROWAVE AMPLIFIER CIRCUIT UTILIZING NEGATIVE RESISTANCE DIODE

BACKGROUND OF THE INVENTION

Generally speaking, there are two approaches to the high power output stage solid state amplifiers for microwave communication systems and the like, both utilizing avalanche diodes.

In one case, the avalanche diodes are used in the negative resistance amplifier mode of operation wherein a plurality of amplifier stages are coupled in series, each stage in turn amplifying the signal passing therethrough from input to output in the chain. The conductance value of such amplifier stages is a rapidly decreasing function of the applied RF voltage and, in order to obtain a reasonable frequency bandwidth of operation, a conductance value is selected which tends to limit the gain of each stage; a typical amplifier stage of reasonable bandwidth will produce a gain of from 3 to 5 dB near the saturated output level. To obtain 1 watt of output power at X band with 30 dB gain may take five amplifier stages; a typical form of such amplifier is noted in *The Microwave Journal*, Vol. 14, Feb. 71, page 34.

The second approach, which provides a higher gain per amplifier stage, employs an injection locked oscillator technique where the avalanche diode oscillator circuit is operated in saturation to produce peak power output at all times, the oscillator tracking the frequency of the incoming microwave signal to produce said peak power out at the input signal frequency. To increase the total power out, the outputs of several locked oscillators are combined.

A typical form of power combiner, locked-oscillator system is shown in an article entitled "Frequency-Modulated Phase-Locked Impatt Power Combiner" by I. Tatsuguchi in IEEE Journal of Solid-State Circuits, Vol. SC–5, No. 6, pages 354–358, December, 1970. The three separate locked-oscillator devices and power combining apparatus utilize, in addition to the three avalanche diode oscillator circuits, 12 microwave circulators and a number of adjustable phase control circuits between the stages.

To meet broadcast regulations, it is necessary to monitor the locked-oscillator form of amplifier system to sense when the system goes out-of-lock so that a suitable alarm may be generated.

BRIEF SUMMARY OF THE PRESENT INVENTION

The present invention provides a novel form of solid state microwave amplifier utilizing a series connected negative resistance diode and an inductor, both connected in a series circuit with an input transmission line for transforming the incoming impedance to a low level. By selection of the value of the transformed impedance, the circuit will operate as a negative resistance amplifier or an oscillator. A high impedance transmission line coupled between the input transmission line and the inductor provides DC biasing to the diode.

By including a varactor diode in the series circuit between the inductor and the input transmission line, and by supplying the varactor with means for controlling the voltage across its terminals, the oscillator is made electrically tunable.

In one embodiment of the invention, the amplifier structure is utilized in a novel locked-oscillator type of microwave amplifier employing an electrically tunable locked-oscillator first stage and a power combiner second stage utilizing a plurality of locked-oscillators. The first stage comprises a voltage tunable varactor diode for tuning the avalanche or IMPATT diode oscillator, the diodes, circuit elements and biasing circuits being interconnected in a novel manner to provide a high power device with a wide tunability range.

The locked oscillators of the second stage are fixed tuned near the center frequency of the overall frequency band, the operating frequency being pulled to and tracking the frequency of the incoming signal. The separate avalanche or IMPATT diode oscillators are provided with separate and independent biasing circuits. A novel coupling circuit is provided at the common power combiner output terminal to prevent power canceling between the oscillators should they be operating out-of-phase.

A novel form of "out-of-lock" monitoring circuit is employed to sense the frequency of operation of the system. A simple coupling is provided to a microwave circulator located between the output of the first stage and the output of the second stage to obtain a sampling of the frequency of the first stage as well as frequency of the second stage. A mixer stage produces a DC output when the two frequencies are the same or in-lock while an AC signal is produced as a result of dissimilar frequencies present when the circuit is out-of-lock.

Thin film techniques are employed to produce the circuit elements, and these circuits are integrated in a package with the avalanche diodes, varactor diode, and circulators on a compact heat sink structure, the complete package providing optimum electrical interfacing between the various circuits as well as excellent heat transfer characteristics.

DESCRIPTION OF THE PREFERRED EMBODIMENTS

Figure 1:
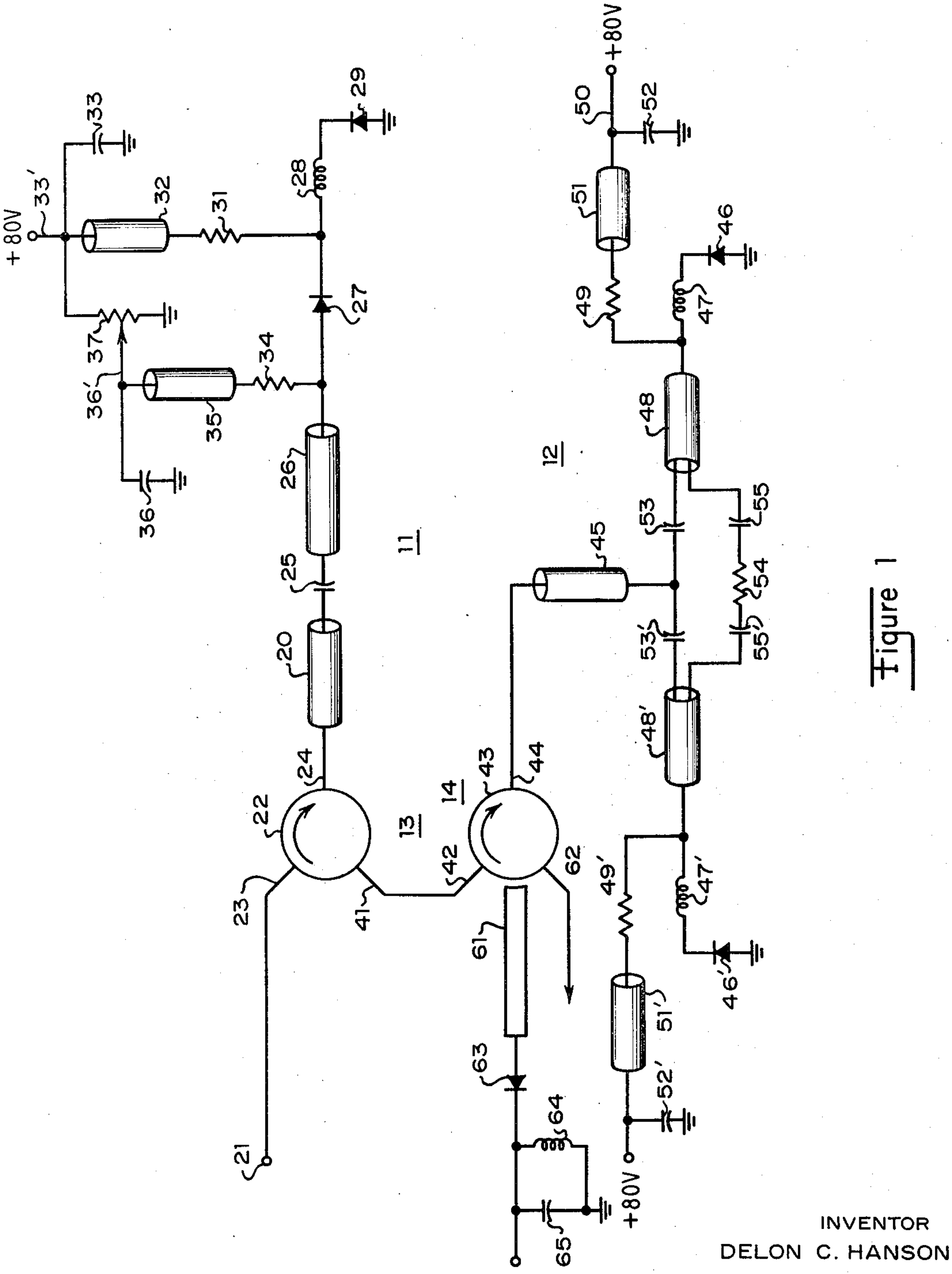
FIG. 1 is a schematic diagram of the two stage amplifier system of the present invention.
Figure 2:
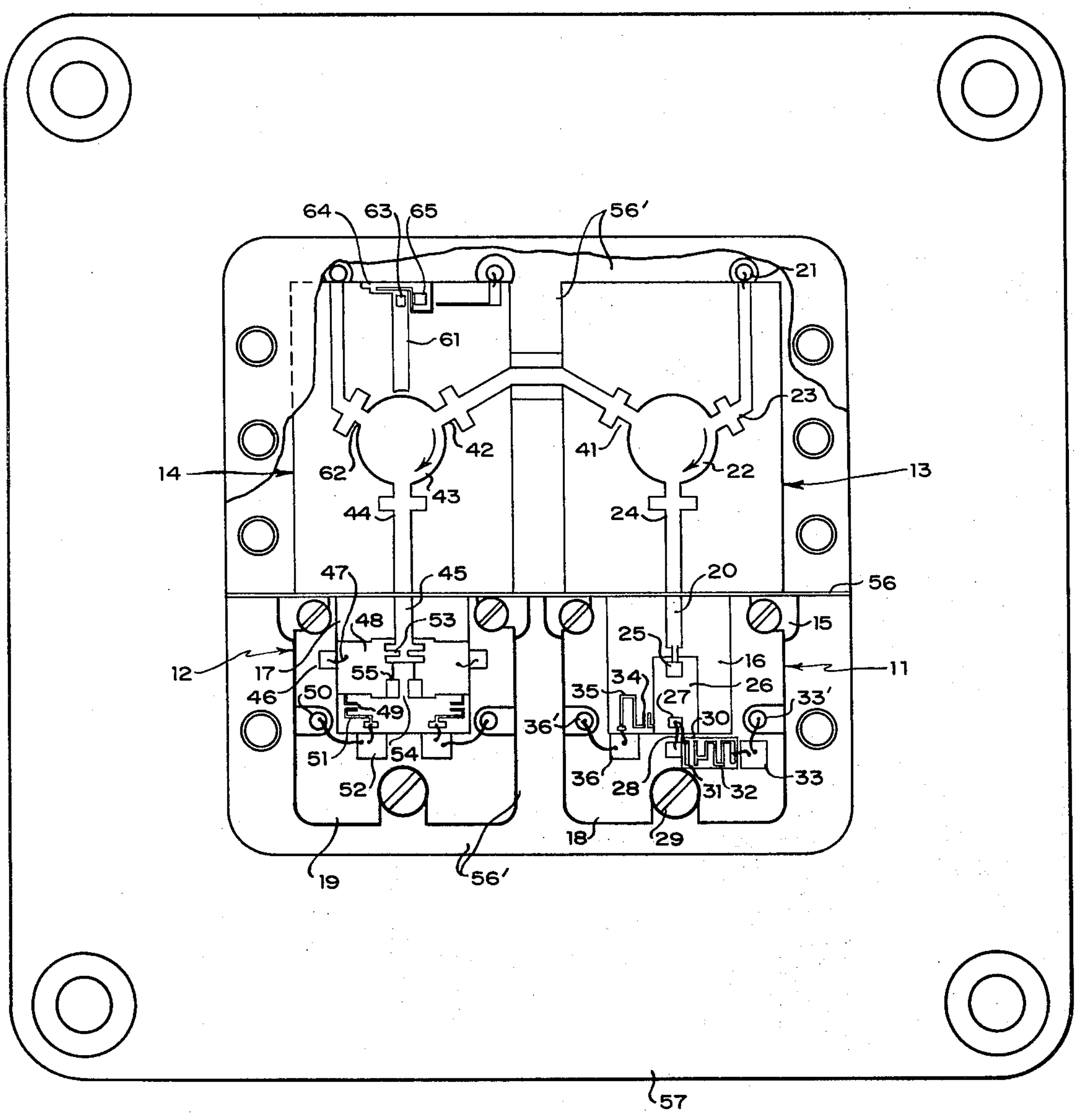
FIG. 2 is a plan view of the structure of the amplifier system of FIG. 1.

Referring to FIGS. 1 and 2 the microwave amplifier package comprises first and second amplifier stages 11 and 12 and two microwave ferrite circulator circuits 13 and 14 mounted on a conducting metallic base 15. The circuits for the first and second stage are formed by thin film techniques on 10 mil thick saphire substrates 16 and 17, these substrates being bonded on 30 mil thick copper carriers 18 and 19, respectively.

The input to the first stage enters the package via input feedthrough 21, passes into the first circulator 22 via input port 23 and passes out to the first amplifier stage via second port 24. The first amplifier stage comprises a 50 ohm transmission line 20 connected by a mesh bond to a capacitor 25 of about 18.6 pF located at the input end of another transmission line 26 with a characteristic impedance of about 10.9 ohm and one quarter wavelength long at about 11 GHz. The transmission line 26 serves to transform the 50 ohm input down to a low impedance of about 2 ohms. A varactor diode 27, inductance line 28 of about 0.6 h, and avalanche diode 29 are connected in series with the inner end of the transmission line 26.

The avalanche diode 29 is mounted as an integrated part of the interchangable carrier heat sink 18 which serves as electrical ground and also as the thermal heat sink for the diode. This provides a significant advantage in combined thermal and electrical performance over standard approaches where the avalanche diodes are separately packaged or mounted on independent heat sinks and require electrical interfacing circuitry with the system. It is noted that the avalanche diode is mounted on the carrier 18 adjacent the edge of the circuit substrate 16 where only a short inductance line 28 is needed for interconnection of the two diodes.

The circuit for providing DC biasing potential for the diodes comprises a quartz substrate 30 on which is formed a high impedance line including a 10 ohm resistor 31 and a transmission line 32 which is one quarter wavelength long at the center frequency, and the 18 pF capacitor 33 mounted on the carrier 18. This high impedance line is at one end coupled to the juncture of the varactor diode 27 and the inductor 28 and coupled at the other end to +80V via feedthrough 33'. A similar high impedance transmission line comprising 10 ohm resistor 34, quarter wave transmission line 35 and 18 pF capacitor 36 is coupled to the varactor diode 27 at its junction with transmission line 25, this high impedance line being DC returned via feedthrough 36' and the external potentiometer 37 of about 25 kilohms to the DC potential source. By adjusting the tap on the potentiometer 37, the voltage across the varactor diode 27 may be varied over a range from 0 to 60 volts and the avalanche diode oscillator circuit tuned over the operating band of the system.

In order to optimize the performance of the avalanche diode oscillator circuit it is necessary to control the effect of parasitics. In this circuit, the transmission line 26 transforms the real part of the input impedance from 50 ohms down to approximately 2 ohms. The series resistance of varactor diode 27 is about 1.9 ohms at O bias and reduces to about 0.9 ohms at breakdown. This series resistance is added directly to the real part of the 2 ohms transformed line impedance. Since the negative resistance of the avalanche diode decreases with increasing frequency, which corresponds to increasing varactor bias voltage, and hence decreasing series resistance of the varactor, direct real part matching is achieved over the frequency range, thus yielding uniform output power. The inductance 28 bonded to the avalanche diode 29 which primarily determines the frequency of oscillator is varied directly by the bias voltage on the varactor diode 27, representing a series tuning of the avalanche diode. Placing the varactor diode other than in series at the end of the input line 26 would produce a transform of the impedance and would result in an undesirable changing of the real impedance across the tuning range.

To avoid the introduction of parasitics to the low impedance varactor tuned oscillator, the high impedance biasing line makes contact with the oscillator circuit at only one point, i.e. to the series tuning inductance 28 interconnecting the varactor and avalanche diodes. The quarter wave length line 32 presents a very high impedance at the center frequency of operation; even at the second harmonic frequency where the impedance of line 32 is low, the 10 ohm resistor 31 maintains the line impedance high relative to the device negative resistance to suppress second harmonic oscillation. A similar high impedance line supplies the variable DC return voltage to the varactor circuit via the external potentiometer 37 without introducing parasitics. The operation is enhanced by the absence of any blocking capacitors in the bias line and DC return line.

This novel oscillator circuit will produce a power output of about 22 dB and a tuning range of about 2 GHz, although this complete amplifier system is designed to operate only over a bandwidth of about 500 MHz, e.g., 10.7 to 11.2 GHz.

By omitting the varactor 27 and the circuit comprising components 34, 35, 36 and 37 used to change the voltage across the varactor, and with the line 26 coupled directly to the inductor 38, a fixed-frequency oscillator circuit results with all the desired characteristics of the tunable version.

The output of the first stage passes into the microwave ferrite circulator 22 via the second port 24 and flows through the third port 41 to the first port 42 of the second ferrite circulator 43 and out of the second port 44 to the power combiner stage 12. The circuit comprises a transmission line 45 of about 35 ohms which acts to transform the 50 ohms incoming impedance down to about 25 ohms.

There are two similar avalanche diode oscillator circuits in this stage and one such oscillator will be described, the elements of the second oscillator bearing the same reference numbers primed as similar components in the first oscillator. An avalanche diode 46 and 0.6 h inductor 47 are connected in series with a 10.9 ohm transmission line 48, which is one quarter wavelength long at the center frequency, an capacitor 52 coupled to 80 volts via feedthrough 50. As with the first stage, the avalanche diodes are mounted directly on the heat sink carrier for enhanced electrical and thermal performance, and the diodes are positioned adjacent the saphire circuit subcarrier for optimized electrical interconnecting.

The two oscillator circuits are arranged in alignment, both being orthogonal to the input-output transmission line 45 and being coupled thereto via capacitors 53, 53' which DC isolate the circuits so that they may employ independent DC biasing.

A novel circuit comprising a loadng resistor 54 and DC isolating capacitors 55, 55' is employed at the end of the transmission lines 48, 48' at a point symmetric with the input-output line 45 to prevent power cancelling between the oscillators. With the oscillators operating in phase and with their power outputs combining in the transmission line 45, the loading resistor has no effect. Should the oscillators be out-of-phase, however, and one tend to feed power into the other to cancel the power of the other, the resistor 54, which is positioned half on each side of th line of symmetry between the oscillators and through the transmission line 45, appears as a 50 ohm termination to the associated oscillator and absorbs any power which would otherwise tend to flow into the other oscillator.

The oscillators of the power combiner stage are fixed tuned to about the center frequency of the operating band, e.g., 10.7 to 11.2 GHz for the particular system shown, the actual frequency of operation being pulled to the frequency of the incoming signal from the first stage. The first stage delivers about a 22 dBm signal to the power combiner stage which boosts the output passed to the utilization circuit via the second circulator 43 to about 30 dBm. Thus, a substantial power amplification is achieved by this system utilizing essentially only three avalanche diodes, one varactor, and two circulators.

A novel coupling circuit is provided to sample and compare the output signal of the first stage 11 with that of the second stage 12 to determine if the system is operating in lock or out-of-lock. A coupling including a transmission line 61 with its coupling end spaced about 0.003 inches from the circulator 43 is coupled to the signal in the circulator from the first stage and also to the signal in the circulator from the power combiner stage. The coupler 61 is located equidistant between the input port 42 and the output port 62 of the circulator 43 so as to provide equal coupling to the two signals. This arrangement provides an approximate −20 dB coupling so that +2 dBm signal is obtained from the input signal to the second stage amplifier and a +10 dBm signal is obtained from the second stage output signal. These signals are delivered by the line 61 to a mixer circuit comprising a diode 63 connected in series with a parallel connected inductor 64 and capacitor 65. When the two frequencies are the same, i.e. the system is in lock, the output of the mixer is DC. When the frequencies are different, an out-of-lock condition, the output of the mixer is an AC signal which serves to warn of the out-of-lock condition. This novel coupler provides a single coupler to the two signals with equal coupling, and with isolation between the mixer circuit and the input and output lines.

A thin copper sheet 56 and metallic wall sections 56′ provide isolation between the various stages of this assembly.

Figure 3:
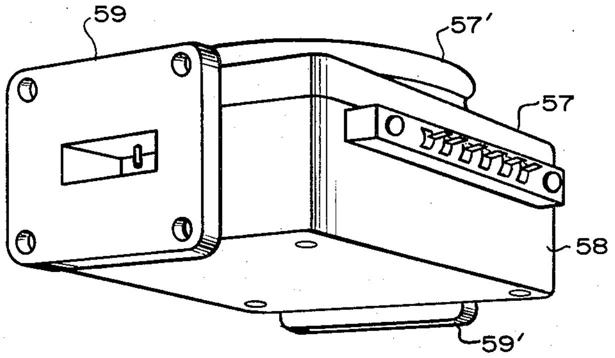
FIG. 3 is perspective view of the assembly package of the system of FIGS. 1 and 2.

The package is designed so that it can be used with coaxial input and output, or coaxial input and waveguide output or vice versa, or both input and output waveguide connections as shown in FIG. 3. The copper carriers 18, 19 are mounted on a rectangular shaped aluminum base 57, and the input and output connections made through the base 57. A suitable cover 57′ is provided on the base. A further base section 58 including waveguide sections 59, 59′ are affixed to the base 57 providing waveguide input and output. This section 58, 59, 59′ may be omitted and coaxial connections made to the input and output connectors extending down through the base 57.

Figure 4:
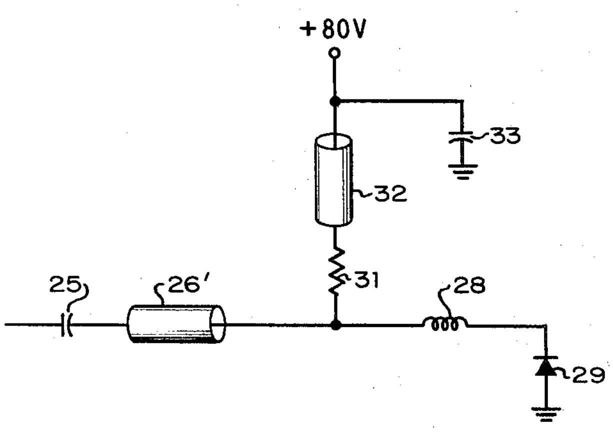
FIG. 4 is a schematic diagram of a negative resistance amplifier embodiment of the present invention.

The structure of stage 11 in a slightly modified form provides a novel form of negative resistance amplifier circuit as shown in FIG. 4. In this amplifier structure, in addition to omitting the varactor diode and the circuit providing the voltage control for the varactor, the impedance value of the transmission line 26′ is chosen (i.e. about 17 ohms) to give a transformed line impedance of about 6 ohms as contrasted with the 2 ohms transformed line impedance utilized for the oscillator circuit. Thus the input real impedance seen by the diode circuit is greater than its own negative impedance and it cannot oscillate. This amplifier circuit may be mounted in integral fashion using substrate 16 and carrier heat sink 18 as described above to obtain good electrical and thermal performance.

In the second stage power combiner, the two devices may be operated as negative resistance amplifiers rather than oscillators by increasing the impedance of lines 48 and 48′ as described above for the first stage, i.e. by shifting the impedance of the circuit up so that the input real impedance sesn by the diode circuits is greater than the negative impedance of the device.

Figure 5:
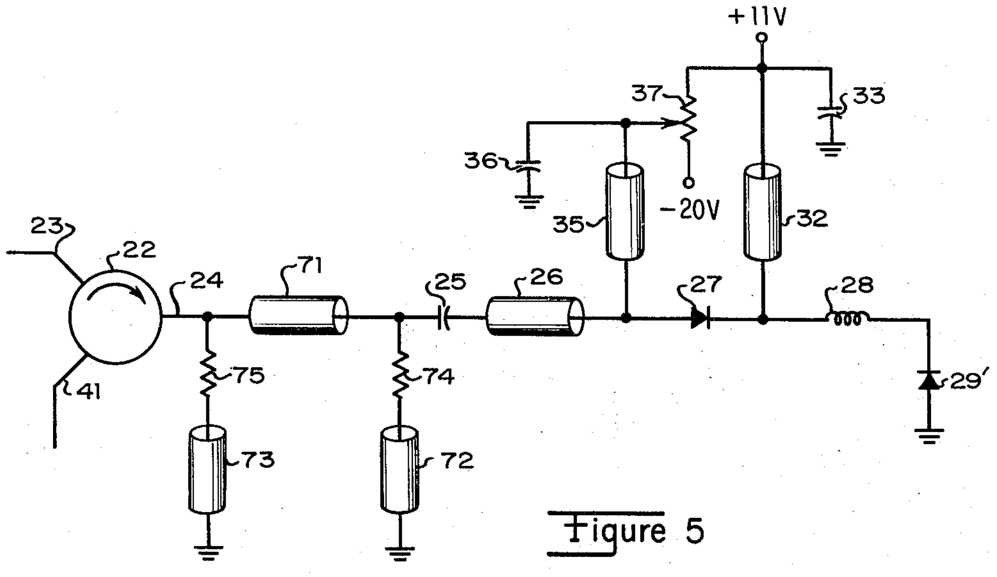
FIG. 5 is a schematic diagram of still another embodiment of the invention.

Referring to FIG. 5 there is shown a first stage oscillator circuit similar to the first stage of FIG. 1 except the avalanche diode 29 has been replaced with a Gunn diode 29′. The two resistors 31 and 34 are not needed in the biasing circuits to the varactor 27 and Gunn diode 29′.

The Gunn diode version has an advantage over the avalance diode circuit in that, when used in a negative amplifier of the type shown in FIG. 4, it provides a lower noise figure, e.g. at least a 15 dB improvement in noise figure when utilized as a negative resistance amplifier circuit and a corresponding improvement when used as an injection locked oscillator. In addition, a larger locking bandwidth is obtained with the Gunn diode version, e.g. a 400 to 450 MHz width for the Gunn diode as compared with a 200 MHz width for the avalanche diode when the input power level is approximately +5 dbm. However, the Gunn diode circuit provides slightly lower output power and thus a smaller locking bandwidth for the second stage.

The circuit of FIG. 5 includes an out-of-band loading circuit which may also be incorporated in the circuit of FIGS. 1 and 4 if desired. This loading circuit replaces the transmission line 20 in the input to the first stage and comprises a series transmission line 71 of about 84 ohms and about one half wavelength long, two shunt transmission lines 72 and 73 each, about 60 ohms and one quarter wavelength long at center frequency, and 45 ohm resistors 74 and 75 in series with the shunt lines. At the frequency of operation, e,g. 11 GHz, the two shunt lines are open circuits and thus the two resistors are effectively removed from the circuit and the series line is a simple transformation circuit which results in a very small loss, e.g. 0.3 to 0.4 dB, over the band of operation. However, on either side of the operating band, the insertion loss increases to about 10 dB at about half and twice the operating frequency. Thus this circuit provides isolation for the diode circuit in the out-of-band regions, particularly at the second harmonic and the subharmonic frequencies. This circuit, in addition to providing ioslation to out-of-band mismatches, helps suppress any second harmonic or subharmonic between the first and second stages of the system.

Figure 6:
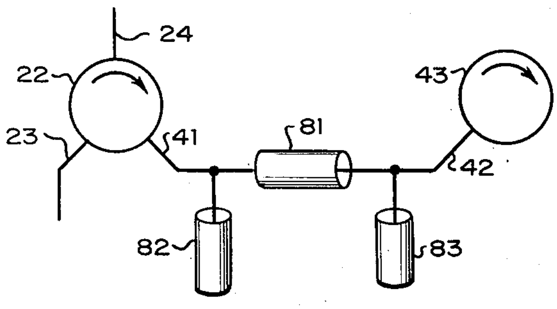
FIG. 6 is a schematic diagram of a modification which may be employed in the several embodiments of this invention.

To provide additional isolation between the two stages, and thus improved stabilization, a second harmonic band reject filter (FIG. 6) matched at the fundamental frequency may be included in the line between the two ports 41 and 42 of the two circulators 22 and 43. This circuit comprises a series line 81 of about 50 ohms and one quarter wavelength long at the operating frequency, and two shunt open stubs 82 and 83 about 75 ohms and one quarter wavelength long at twice the operating frequency.

I claim:

1. A microwave amplifier comprising:

a transmission line having an input end and an inner end for coupling an incoming signal present at the input end thereof into the amplifier and for coupling an output signal therefrom;

a plurality of amplifier means, each having a signal port and including a semiconductor element which is operative with an impedance of selected value coupled to the signal port to provide signal gain in response to applied bias signal;

coupling means for coupling the signal ports of said amplifier means in parallel to said inner end of said transmission line and for providing D.C. isolation between the amplifier means at their juncture with said transmission line;

said coupling means including a load impedance differentially coupled between the signal ports of a pair of said plurality of amplifier means for loading said amplifier means only in response to output signals therefrom which are not in phase; and separate biasing circuits coupled to each of said amplifier means for providing bias signals to each associated semiconductor element independent of the other amplifier means.

2. A microwave amplifier as in claim 1 wherein said coupling means includes a signal conductor on an insulating substrate mounted on a metallic heat sink carrier, said semiconductor element associated with each of said amplifier means being mounted directly on said carrier, and an inductor interconnecting said signal conductor and said semiconductor element.

3. A microwave amplifier as in claim 1 for amplifying incoming signals within a particular frequency band comprising:

first means including an input, an output, and an oscillator comprising a negative resistance diode coupled to said input and said output, said oscillator locking to the frequency of said incoming signal and producing an amplified signal at said frequency at said output;

said plurality of amplifier means forming a power combining amplifier stage including an input coupled to the output of said first means for receiving amplified signal therefrom, and including a plurality of oscillators each including a negative resistance diode as said semiconductor element, each of said plurality of amplifier means being coupled to receive said amplified signal in parallel for locking said oscillators to the frequency of said amplified signal to produce an amplified output signal at said input frequency;

an output for connection to a utilization circuit; and said coupling means loads said oscillators only in response to output signals at said signal ports which are not in phase.

* * * * *